United States Patent
Konishi et al.

[11] Patent Number: 5,801,429
[45] Date of Patent: Sep. 1, 1998

[54] SEMICONDUCTOR DEVICE

[75] Inventors: Yuzuru Konishi; Kyotaro Hirasawa; Kazunori Taguchi, all of Fukuoka, Japan

[73] Assignee: Mitsubishi Denki Kabushiki Kaisha, Tokyo, Japan

[21] Appl. No.: 746,415

[22] Filed: Nov. 12, 1996

Related U.S. Application Data

[62] Division of Ser. No. 407,637, Mar. 21, 1995, Pat. No. 5,621,237.

[30] Foreign Application Priority Data

Apr. 12, 1994 [JP] Japan ................... 6-073128

[51] Int. Cl.$^6$ .......... H01L 31/0203; H01L 29/74; H01L 31/111; H01L 23/48
[52] U.S. Cl. ............. 257/433; 257/115; 257/116; 257/88
[58] Field of Search ............... 257/433, 432, 257/431, 98, 100, 99, 115, 116, 688, 690, 678

[56] References Cited

U.S. PATENT DOCUMENTS

| | | | |
|---|---|---|---|
| 4,677,454 | 6/1987 | Kiyohara | 257/48 |
| 4,719,500 | 1/1988 | Tokunoh | 257/688 |
| 5,345,096 | 9/1994 | Grüning | 257/688 |

FOREIGN PATENT DOCUMENTS

| | | | |
|---|---|---|---|
| 00 64 383 | 11/1982 | European Pat. Off. | 257/688 |
| 0 567 996 | 11/1993 | European Pat. Off. | |
| 353011579 A | 2/1978 | Japan | 257/688 |
| 58-207644 | 12/1983 | Japan | 257/688 |
| 58-215041 | 12/1983 | Japan | 257/688 |
| 59-200441 | 11/1984 | Japan | 257/688 |
| 4-129232 | 4/1992 | Japan | 257/688 |
| 2 239 127 | 6/1991 | United Kingdom | 257/688 |

OTHER PUBLICATIONS

Patent Abstracts of Japan, vol. 12, No. 385 (E–668)(3232), Oct. 14, 1988, JP 63–128650, Jun. 1, 1988.

Primary Examiner—Mahshid D. Saadat
Assistant Examiner—Jhihan B. Clark
Attorney, Agent, or Firm—Oblon, Spivak, McClelland, Maier & Neustadt, P.C.

[57] ABSTRACT

It is an object of the present invention to fix a semiconductor substrate and a thermal compensating plate in the alloy-free structure. An insulation resin (23) for side wall protection fixed on the outer periphery of a semiconductor substrate (1) and a projection (6a) inside an insulation tube are bonded with an adhesive agent (24) to restrict movements of the semiconductor substrate (1) in the radial direction. A thermal compensating plate (3) and a main electrode (5) are normally positioned with each other by a screw pin (32). A fixing ring (30) having resin or metal such as aluminum or the like which fits to the outer peripheral side of the main electrode (4) and the outer peripheral side of the thermal compensating plate (2) and the edge part of the upper main surface thereof restricts movement of the thermal compensating plate (2) in the radial direction. Further, a spring (31) interposed between a flange portion (4c) of the main electrode (4) and the fixing ring (30) presses and energizes the thermal compensating plates (2, 3) and the semiconductor substrate (1) against the main electrode (5). Since the free movements of the semiconductor substrate and the thermal compensating plates is restricted, the semiconductor substrate can be prevented from damage.

16 Claims, 5 Drawing Sheets

SECTION A-A

SEMICONDUCTOR DEVICE

This is a Division of application Ser. No. 08/407,637 filed on Mar. 21, 1995, now U.S. Pat. No. 5,621,237.

BACKGROUND OF THE INVENTION

1. Field of the Invention

The present invention relates to semiconductor devices, and particularly to improvement in the structure for positioning semiconductor substrates and the structure for positioning parts for transmitting light signals functioning as trigger signals.

2. Description of the Background Art

FIG. 9 is a front sectional view showing an example of a pressure contact type thyristor of the light trigger type which is one of conventional pressure contact type semiconductor devices. As shown in FIG. 9, in this pressure contact type thyristor, a thermal compensating plate 3 formed of material having its coefficient of thermal expansion approximate to that of a semiconductor substrate 1 is attached to the lower main surface of the semiconductor substrate 1 having the thyristor elements built therein. This thermal compensating plate 3 and the semiconductor substrate 1 are soldered to each other with solder material such as aluminum or aluminum-silicon.

The thermal compensating plate 3 is subjected to the shaping processing at its end surface, and also subjected to the chemical treatment, and further, the surface treatment agent is applied thereto. A main electrode 5 formed of copper abuts on the lower main surface of the thermal compensating plate 3. This main electrode 5 is silver-soldered to an insulation tube 6 formed of ceramics through a metal plate 8.

Another thermal compensating plate 2 is provided on the upper main surface of the semiconductor substrate 1. This thermal compensating plate 2 is made to adhere to the upper main surface of the semiconductor substrate 1 with silicone rubber, for example. A main electrode 4 formed of copper abuts on the upper main surface of the thermal compensating plate 2. The main electrode 4 is silver-soldered to the insulation tube 6 formed of ceramics through a metal plate 7.

The insulation tube 6 establishes insulation between the two main electrodes and forms a housing accommodating the semiconductor substrate 1 and the like inside together with the main electrodes 4, 5 and the metal plates 7, 8. A metal tube 11a for guiding light signals and a metal tube 11b functioning as an exhaust spigot are attached to the insulation tube 6 by silver soldering.

A light guide 10 for guiding the light signals inputted from outside to a light receiving portion is inserted in the metal tube 11a. This light guide 10 airtightly adheres to the metal tube 11a with an adhesive agent such as solder or glass with low melting point. The light receiving portion 1a is provided at the center part of the semiconductor substrate 1, to which the light emitting end of the light guide 10 is fixedly coupled.

The light guide 10 and the light receiving portion 1a are bonded by using an optical coupling agent 21 such as silicone rubber or the like which has optical transparency, refractive index approximate to that of the light guide 10, and buffering effect. The light guide 10 is fixed to prevent a decrease of the coupling efficiency of the optical transmission system to transmit optical power as large as possible to the light receiving portion 1a.

The inside of the above-described housing is made airtight, and inert gas is sealed therein. With the semiconductor substrate 1, the thermal compensating plate 2, and the thermal compensating plate 3 accommodated in the housing, the end surface of the metal plate 8 silver-soldered to the main electrode 5 and the insulation tube 6 are finally welded, and the gas remaining inside is exhausted through the metal tube 11b and replaced by inert gas, and then the end portion of the metal tube 11b is arc-welded to realize the airtightness of the housing and seal of the inert gas.

The light signal is transmitted through an external optical fiber (not shown) from an external LED, LD, etc. (not shown), which serves as a light source, and then guided to the light entering end of the light guide 10 through an external connector (not shown). The light guide 10 changes the direction of progress of the incident light signal by 90° and irradiates the light receiving portion 1a from the light emitting end facing to the light receiving portion 1a of the semiconductor substrate 1.

The semiconductor substrate 1 converts the light signal into the photoelectric current in the vicinity of the light receiving portion 1a and amplifies the photoelectric current to establish a conductive state between the two main electrodes 4 and 5. That is to say, this device performs switching operation triggered by the light signals.

FIG. 10 is a front sectional view of another conventional pressure contact type thyristor disclosed in Japanese Patent Laying-Open No. 4-120772. This device is a GTO (Gate Turn Off) thyristor of the electric trigger type having the so-called alloy-free structure, in which the semiconductor substrate 1 and the thermal compensating plates 2 and 3 are not soldered.

This device is different from the device shown in FIG. 9 in that the semiconductor substrate 1 and the thermal compensating plates 2, 3 are not soldered, so that heat distortion resulted from difference in coefficients of thermal expansion among them, i.e., the warp transformation caused by the temperature change is suppressed to about several μm. Accordingly, as uniform pressure welding is realized between the thermal compensating plates 2, 3 and the main electrodes 4, 5, it is advantageous in that the thermal and electric contact resistances are low in the pressure contact.

In FIG. 10, the same characters are allotted to the same parts as those in the device shown in FIG. 9, and detailed descriptions thereof are not repeated. In the device shown in FIG. 10, the semiconductor substrate 1 is subjected to the shaping processing at its end surface, and then to the chemical treatment, and further, the surface treatment agent is applied thereto. Stepping processing is applied to the end surface of the thermal compensating plate 3, and the semiconductor substrate 1 is made to adhere to the step portion with silicone rubber 23 or the like. The adhesion is made only at the end, so that thermal distortion does not occur in the thermal compensating plate 3 as described above.

Furthermore, similarly to the device of FIG. 9, the main electrode 4, the metal plate 7 and the metal tube 11 are silver-soldered to the insulation tube 6 formed of ceramics to form a housing. A groove is formed in the center portion of the bottom of the main electrode 4 abutting on the thermal compensating plate 2, in which groove a guide ring 50 formed of an insulating material is inserted. An output end of a gate lead line 60 transmitting the electric trigger signals is incorporated in this guide ring 50, and its one input end passes through the metal tube 11.

The guide ring 50 presses and energizes the output end of the gate lead line 60 against the upper main surface of the semiconductor substrate 1 with the elastic force of a spring 31. The portion between the input end and the output end of the gate lead line 60 is covered with an insulating tube 61. The insulating tube 61 prevents electric contact of the gate lead line 60 with the main electrode 4.

Similarly to the device of FIG. 9, the housing is made airtight inside and inert gas is sealed therein. With the semiconductor substrate 1, the thermal compensating plate 2 and the thermal compensating plate 3 accommodated in the housing, the end surface of the metal plate 8 silver-soldered to the main electrode 5 and the insulation tube 6 are welded at last, and the gas remaining inside is exhausted through the metal tube 11 and replaced by the inert gas, and then the end of the metal tube 11 is arc-welded to realize the airtightness of the housing and sealing of the inert gas.

As the conventional semiconductor devices are configured as discussed above, they have such problems as listed below.

First, as the semiconductor substrate 1 and the thermal compensating plate 3 are bonded by means of the solder material in the conventional pressure contact type semiconductor device, it has been a problem that warp transformation is caused in the coupled body of the semiconductor substrate 1 and the thermal compensating plate 3 by the difference in thermal shrinkage resulted from the difference in the thermal expansion coefficients of the two when they are cooled after the alloy process, resulting in uneven contact surfaces between the semiconductor substrate 1 and the main electrodes 4, 5 to decrease the yield of the device. Particularly, with the recent increase of calibers of the devices, this problem is becoming more serious.

As a countermeasure, such devices as have the alloy-free structure in which the semiconductor substrate 1 and the thermal compensating plate 3 are not alloyed as described above are appearing. However, this conventional device of the alloy-free type involves a problem that the semiconductor substrate 1 and the thermal compensating plate 3 move in the radial direction or in the axial direction when assembled or transported because they are not fixed and cause damage of the semiconductor substrate 1. Particularly, the devices of the optical trigger type involve the problem that the light guide 10 may be damaged, or the relative position of the light receiving portion 1a of the semiconductor substrate 1 and the light emitting end of the light guide 10 may be displaced, so that the light signals are not transmitted to the semiconductor substrate 1, with the result that the device does not operate adequately.

Second, in the conventional light trigger semiconductor device, the loss heat generated in the semiconductor substrate 1 by the passage of current is transmitted to outside through the thermal compensating plates 2, 3 and the electrodes 4, 5 to prevent the semiconductor substrate 1 from being overheated. However, a notch 4a is formed in the main electrode 4 to introduce the light guide 10 for transmitting the light signals, and a groove with certain volume is formed in the center portion of the bottom of the main electrode 4 when a guide ring or the like is used for normally positioning the output end of the light guide 10 to the light receiving portion 1a of the semiconductor substrate 1. The conventional device has a problem that the transmission efficiency of the loss heat decreases more as the volume of the notch 4a and the groove becomes larger.

Third, when assembling the conventional light trigger semiconductor device, the light guide 10 is introduced, and then, welding is performed between the metal plate 7 previously fixed to the periphery of the main electrode 4 and the insulation tube 6 to fixedly join the main electrode 4 to the insulation tube 6. Accordingly, it has been a problem that the main electrode 4 turns when temporarily assembled in the process before the welding is finished and the notch 4a touches the light guide 10 to give damage to the light guide 10.

Fourth, as both the light entering end and the light emitting end of the light guide 10 are fixed in the conventional light trigger semiconductor device, there is a possibility of damaging the light guide 10 by the expansion and shrinkage of parts caused by repeated temperature change. In addition, it is a problem that the yield of the device decreases in the process of incorporating the light guide 10 into the device, i.e., in the process of adhesion using solder and realizing the airtight state.

Fifth, as the conventional pressure contact type semiconductor device of the alloy-free structure is constructed as shown in FIG. 10, the end of the semiconductor substrate 1 must be stuck to the thermal compensating plate 3 so that the semiconductor substrate 1 and the thermal compensating plate 3 will not slip off from the predetermined relative position, and this process is not easy. Furthermore, as the silicone rubber or the like used for adhesion has fluidity, it may flow in between the semiconductor substrate 1 and the thermal compensating plate 3.

SUMMARY OF THE INVENTION

According to the present invention, a pressure contact type semiconductor device comprises a semiconductor substrate, a thermal compensating plate in alloy-free contact with the semiconductor substrate, and a main electrode in contact with the thermal compensating plate, wherein the thermal compensating plate and the main electrode fit to different ends of a pin to be positioned relatively to each other.

According to the pressure contact type semiconductor device of the present invention, since the main electrode and the thermal compensating plate in contact with each other fit to the common pin to be fixed, damage of the semiconductor substrate caused by displacement thereof in transportation and the like before use of the device can be prevented.

Preferably, in the pressure contact type semiconductor device according to the invention, the thermal compensating plate and the main electrode fit to the pin only at approximate center positions of the respective contact surfaces.

According to the pressure contact type semiconductor device of the invention, since the thermal compensating plate and the main electrode fit to the common pin only at a single position at the approximate center thereof, positional slipping off in the radial direction can be prevented with the simplest structure.

In another aspect of the present invention, a pressure contact type semiconductor device comprises a semiconductor substrate and an insulation tube surrounding the semiconductor substrate, wherein the semiconductor substrate is fixed to an inner wall of the insulation tube.

In the pressure contact type semiconductor device of the invention, as the semiconductor substrate is fixed to the insulation tube, there is no possibility that the semiconductor substrate moves to abut on the inner wall of the insulation tube or the like to be damaged.

Preferably, in the pressure contact type semiconductor device according to the invention, a projection projecting inwardly is formed on the inner wall of the insulation tube and the semiconductor substrate is fixed to the projection.

In the pressure contact type semiconductor device of the invention, as the semiconductor substrate is fixed to the projection formed on the inner wall of the insulation tube, the semiconductor substrate can be easily fixed.

Preferably, in the pressure contact type semiconductor device according to the invention, the semiconductor substrate is fixed to the projection by using an adhesive agent.

In the pressure contact type semiconductor device of the invention, as the semiconductor substrate is fixed to the projection by using the adhesive agent, the semiconductor substrate can be fixed more easily.

Preferably, in the pressure contact type semiconductor device according to the invention, the semiconductor substrate is fixed to the projection through a protection resin provided on a periphery of the substrate.

In the pressure contact type semiconductor device of the invention, as the semiconductor substrate is fixed to the projection through the resin for protection, damage to the semiconductor substrate caused by vibration, impact and the like applied from outside can be prevented.

Preferably, in the pressure contact type semiconductor device according to the invention, the projection is formed on entire periphery of the inner wall.

In the pressure contact type semiconductor device of the invention, since the projection is formed all around the entire periphery of the inner wall of the insulation tube, the semiconductor substrate is stably fixed.

Preferably, in the pressure contact type semiconductor device according to the invention, inside of the insulation tube accommodating the semiconductor substrate is airtight from outside and a through hole is formed in the projection.

In the pressure contact type semiconductor device of the invention, as the inside of the insulation tube is made airtight from outside, the inert gas can be introduced into it to improve the stability of operation of the semiconductor substrate and the like and to extend the life-time thereof. Furthermore, as the through hole is formed in the projection, the two regions inside the insulation tube partitioned by the semiconductor substrate communicate with each other through the through hole when the semiconductor substrate is bonded to the projection. Accordingly, unnecessary gas remaining inside can be exhausted from both of the two regions through an exhaust spigot provided only at one position of the insulation tube before the device has been assembled, and an inert gas can be substituted for the same.

In another aspect of the present invention, a pressure contact type semiconductor device comprises a semiconductor substrate and an insulation tube surrounding the semiconductor substrate, wherein the semiconductor substrate is fixed to an inner wall of the insulation tube through a protection resin.

In the pressure contact type semiconductor device of the invention, since the semiconductor substrate is fixed to the inner wall of the insulation tube through the resin for protection, there is no possibility of the semiconductor substrate moving to abut on the inner wall of the insulation tube or the like to be damaged. Also, damage to the semiconductor substrate caused by vibration, impact, etc. applied from outside can be prevented.

In another aspect of the present invention, a pressure contact type semiconductor device comprises a semiconductor substrate, a main electrode pressure-contacted to the semiconductor substrate, and a control signal transmission path for transmitting a control signal to the semiconductor substrate, wherein the main electrode defines a groove accommodating the control signal transmission path and the shape of the groove has its opening width increasing from a deeper portion toward an opening portion.

In the pressure contact type semiconductor device of the invention, as the groove accommodating the control signal transmission path has a shape which has its width of opening increasing from the deeper portion toward the opening portion, such as a tapered shape, accommodation of the control signal transmission path is easy and the volume of the groove can be small. Accordingly, the loss heat produced in the semiconductor substrate can be effectively radiated to outside.

The present invention is also directed to a light trigger type semiconductor device. According to the present invention, the light trigger type semiconductor device comprises a semiconductor substrate, an insulation tube surrounding the semiconductor substrate and a light guide transmitting a light signal to the semiconductor substrate, wherein a part of the light guide is accommodated in a tubular body and attached to the insulation tube.

In the light trigger type semiconductor device of the invention, since a part of the light guide which is easy to be damaged is accommodated in a tubular body and attached to the insulation tube, the light guide is not likely to be damaged.

Preferably, in the light trigger type semiconductor device according to the invention, the tubular body projects inside the insulation tube and the light guide is inserted into the tubular body with play.

In the light trigger type semiconductor device of the invention, as a part of the light guide is inserted into a tubular body projecting inside the insulation tube, it can be prevented that other parts such as the main electrode arranged inside the insulating tube directly abut on the light guide. Further, as the light guide is inserted into the tubular body with play, impact will not be transmitted to the light guide if other parts abut on the tubular body. Accordingly, damage of the light guide can be prevented particularly when assembling the device.

Preferably, in the light trigger type semiconductor device according to the invention, a part of the light guide is inserted into the tubular body through an elastic tubular body.

In the light trigger type semiconductor device of the invention, since a part of the light guide is inserted into the tubular body through the elastic tubular body, damage of the light guide caused by vibration, impact and the like applied to the device from outside and transmitted to the light guide can be prevented.

In another aspect of the present invention, a light trigger type semiconductor device comprises a semiconductor substrate, an insulation tube surrounding the semiconductor substrate and a light guide transmitting a light signal to the semiconductor substrate, wherein a part of the light guide is attached to the insulation tube through an elastic tubular body.

In the light trigger type semiconductor device of the invention, as a part of the light guide is attached to the insulation tube through the elastic tubular body, damage of the light guide caused by vibration, impact and the like applied to the device from outside and transmitted to the light guide can be prevented.

In another aspect of the present invention, a light trigger type semiconductor device comprises a semiconductor substrate, a light guide transmitting a light signal to a light receiving surface of the semiconductor substrate and a guide ring fixed on the semiconductor substrate to surround the light receiving surface, wherein a light emitting end of the light guide is inserted into the guide ring.

In the light trigger type semiconductor device of the invention, as the light emitting end of the light guide is inserted into the guide ring, the light emitting end of the light guide can be easily positioned to an adequate position with respect to the light receiving surface.

Preferably, the light trigger type semiconductor device according to the invention comprises the guide ring as a first guide ring, and further comprises a second guide ring into which the light emitting end of the light guide is inserted, wherein the light emitting end of the light guide is inserted in the first guide ring with play and the second guide ring fits to the outer periphery of the first guide ring.

In the light trigger type semiconductor device of the invention, as two kinds of guide rings are used, these guide rings can be fitted to each other to easily position the light emitting end.

Preferably, in the light trigger type semiconductor device according to the invention, the light emitting end of the light guide is fixed inside the guide ring by an adhesive optical coupling agent put inside the guide ring.

In the light trigger type semiconductor device of the invention, since the light emitting end of the light guide is fixed in the guide ring with the optical coupling agent having adhesion, the thermal stresses are absorbed by the optical coupling agent. Further, transmission of light signals from the light emitting end of the light guide to the light receiving surface of the semiconductor substrate can be made efficiently.

In another aspect of the present invention, a pressure contact type semiconductor device comprises a semiconductor substrate, a thermal compensating plate in contact with the semiconductor substrate and a main electrode in contact with the thermal compensating plate, and it further comprises a ring which fits to outer peripheries of both of the thermal compensating plate and the main electrode.

In the pressure contact type semiconductor device of the invention, the thermal compensating plate is restricted to the main electrode by the ring. Accordingly, there is no possibility of the thermal compensating plate sliding along the semiconductor substrate to give damage to the semiconductor substrate.

Preferably, the pressure contact type semiconductor device according to the invention further comprises an elastic body interposed between the main electrode and the ring, wherein the ring engages with an edge portion of a surface, abutting on the main electrode, of the thermal compensating plate, and the ring is pressed and energized against the thermal compensating plate by an elastic force of the elastic body.

In the pressure contact type semiconductor device of the invention, since the ring engages with the edge portion of the surface of the thermal compensating plate which abuts on the main electrode and the ring is pressed and energized against the thermal compensating plate by the action of the elastic body, damage of the semiconductor substrate caused because the semiconductor substrate and the thermal compensating plate individually vibrate due to impact etc. applied from outside.

Accordingly, it is an object of the present invention to provide a semiconductor device in which a semiconductor substrate and a thermal compensating plate are fixed, heat generated inside the device is effectively transmitted to outside, damage of a light guide is prevented, and the light guide is easily assembled into the device.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
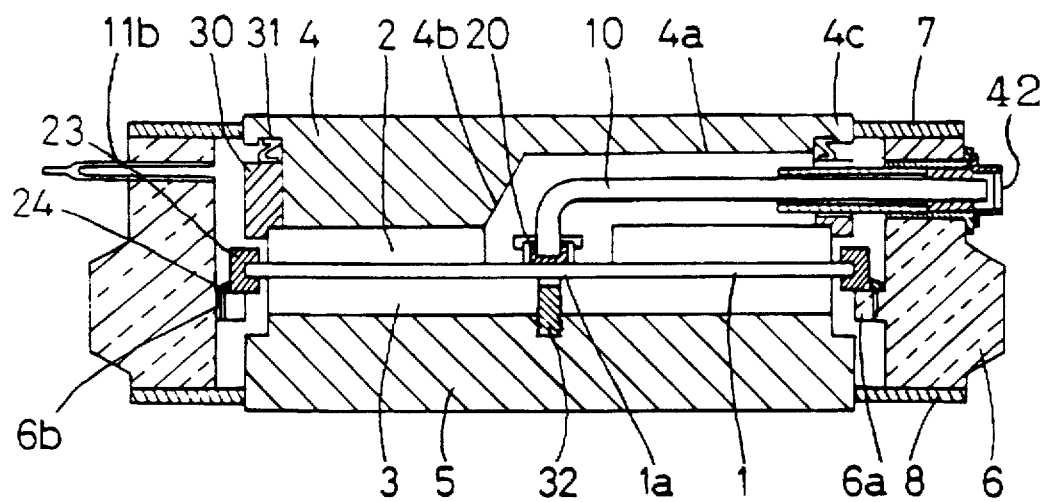
FIG. 1 is a front sectional view of a pressure contact type semiconductor device in the preferred embodiment.

A preferred embodiment of the present invention will now be described referring to the figures. FIG. 1 is a front sectional view of a pressure contact type thyristor of the light trigger type in this preferred embodiment. In this device, a light receiving portion 1a is provided at the center portion of the upper main surface of the semiconductor substrate 1. A light emitting end of a light guide (control signal transmission path) 10 for transmitting light signals (control signals) inputted from outside faces to this light receiving portion 1a.

A thermal compensating plate 2 and a thermal compensating plate 3 abut on the upper main surface and the lower main surface of the semiconductor substrate 1, respectively. These thermal compensating plates 2 and 3 are not alloyed to the semiconductor substrate 1 by soldering or the like, but they are pressure-contacted to the main surfaces of the semiconductor substrate 1 in the so-called alloy-free manner.

The thermal compensating plates 2 and 3 are held between the main electrodes 4 and 5, respectively. These main electrodes 4 and 5 are fixed to an insulation tube 6 formed of ceramics, for example, through circular ring like metal plates 7 and 8, respectively. The insulation tube 6 has an outward projection, or a concave-convex portion for suppressing creeping discharge on its outer periphery. The insulation tube 6 also has a projection 6a projecting inwardly along its inner periphery.

The thermal compensating plate 3 and the main electrode 5 are normally positioned by a screw pin (pin) 32. That is to say, a through hole is provided at the center of the thermal compensating plate 3 and a tapped hole is provided at the center of the corresponding main electrode 5, where the screw 32 which threadingly engages the tapped hole gets into the through hole of the thermal compensating plate 3 to restrict movement of the thermal compensating plate 3 in the radial direction. As the thermal compensating plate 3 does not move in the radial direction, it does not give damage to the semiconductor substrate 1. Furthermore, it does not damage nor move insulation resin (resin for protection) 23, described later, attached to the outer periphery of the semiconductor substrate 1, either.

Moreover, the screw pin 32 threadingly engages the tapped hole of the main electrode 5 not to move in the axial direction of the through hole, so that it will not collide with the semiconductor substrate 1 to damage it. Also, the screw pin 32 prevents the movement in the radial direction in the thermal compensating plate 3 with the simplest structure of engaging only at the center portion of the thermal compensating plate 3 and the main electrode 5.

Figure 2:
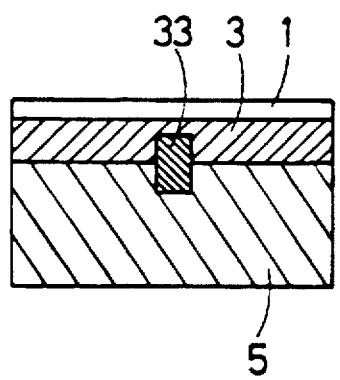
FIG. 2 is a fragmentary enlarged front sectional view of the device in the preferred embodiment.
Figure 3:
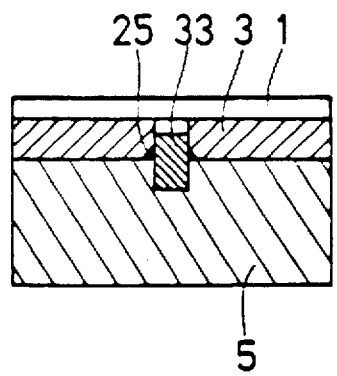
FIG. 3 is a fragmentary enlarged front sectional view of the device in the preferred embodiment.

A pin which has no screw can be used instead of the screw pin 32. Examples thereof are shown in FIG. 2 and FIG. 3. These FIG. 2 and FIG. 3 are fragmentary enlarged sectional views of the vicinity of the center part of the thermal compensating plate 3 shown in FIG. 1.

In the example shown in FIG. 2, a hole having a bottom is provided in place of the through hole at the center of the thermal compensating plate 3, and a hole having a bottom similar to that of the thermal compensating plate 3 is provided in place of the tapped hole at the center of the corresponding main electrode 5. A pin 33 having no screw is used in place of the screw pin 32, and this pin 33 gets into the both holes having bottoms to realize normal position of the thermal compensating plate 3 and the main electrode 5.

In this example, the movement of the thermal compensating plate 3 in the radial direction is also restricted, so it will not damage nor move the insulating resin 23 attached on the outer periphery of the semiconductor substrate 1. Furthermore, as the hole provided in the thermal compensating plate 3 is not a through hole but a hole having a bottom, the pin 33 will not hit the semiconductor substrate 1 to give damage to the semiconductor substrate 1.

In the example shown in FIG. 3, the pin 33 not only gets in the hole with the bottom of the main electrode 5, but it is also soldered with a solder material 25. Accordingly, the pin 33 will not move in the axial direction of the hole, so that the hole provided in the thermal compensating plate 3 may be a through hole as shown in FIG. 3. Also, instead of soldering the pin 33 to the main electrode 5, it may be soldered to the thermal compensating plate 3. Any of these structures can produce the same effects as the structure using the screw pin 32.

Referring to FIG. 1 again, a fixing ring 30 fitting to the outer peripheral surface of the main electrode 4, and the outer peripheral surface and the edge portion of the upper main surface of the thermal compensating plate 2 restricts the movement of the thermal compensating plate 2 in the radial direction. Accordingly, the thermal compensating plate 2 will not slide along the semiconductor substrate 1 to give damage to the semiconductor substrate 1 or to damage the insulation resin 23. The fixing ring 30 is formed of resin or metal such as aluminum or the like.

The main electrode 4 has a flange portion 4c projecting outwardly at the upper end of its outer peripheral surface. A spring (elastic body)31 such as a spring coil, a corrugated ring spring, or a belleville spring is interposed between the lower surface of this flange portion 4c and the upper end of the fixing ring 30.

The fixing ring 30 presses and energizes the thermal compensating plates 2 and 3 and the semiconductor substrate 1 against the main electrode 5 with the elastic force of this spring 31. Accordingly, there is no possibility of the semiconductor substrate 1 and the thermal compensating plates 2 and 3 individually moving in the axial direction due to the vibration caused by the spring action of the metal plates 7 and 8 to damage the semiconductor substrate 1 and the light guide 10. Also, such a problem as damaging bonding between the light emitting end of the light guide 10 and the light receiving portion 1a of the semiconductor substrate is avoided, and the decrease in the yield of the device is suppressed. At the same time, the action of the spring 31 makes the surface contact of the thermal compensating plates 2, 3 and the semiconductor substrate 1 uniform to improve the heat radiating characteristics and the like.

The movement of the semiconductor substrate 1 in the radial direction is restricted by bonding the insulation resin 23 for side wall protection adhering to the periphery of the semiconductor substrate 1 and the projection 6a in the insulation tube with the adhesive agent 24. As the movement of the semiconductor substrate 1 in the radial direction is restricted, damage caused by the semiconductor substrate 1 sliding between the thermal compensating plates 2 and 3, or the damage caused by abutting on the inner wall of the insulation tube 6 can be avoided. Furthermore, since it is fixed through the insulation resin 23, vibration and impact applied from outside are absorbed by this insulation resin 23. Accordingly, damage of the semiconductor substrate 1 due to the vibration and impact can also be suppressed.

Restricting the movements of the semiconductor substrate 1 in the radial direction is also helpful in positioning the light emitting end of the light guide 10 and the light receiving portion 1a of the semiconductor substrate. That is to say, if the positions of the light emitting end of the light guide 10 and the light receiving portion 1a are registered and then they are bonded with the adhesive agent 24, errors in dimension among parts resulted from the dimensional tolerances of the light guide 10 or the like can be adjusted to realize precise positioning.

Figure 4:
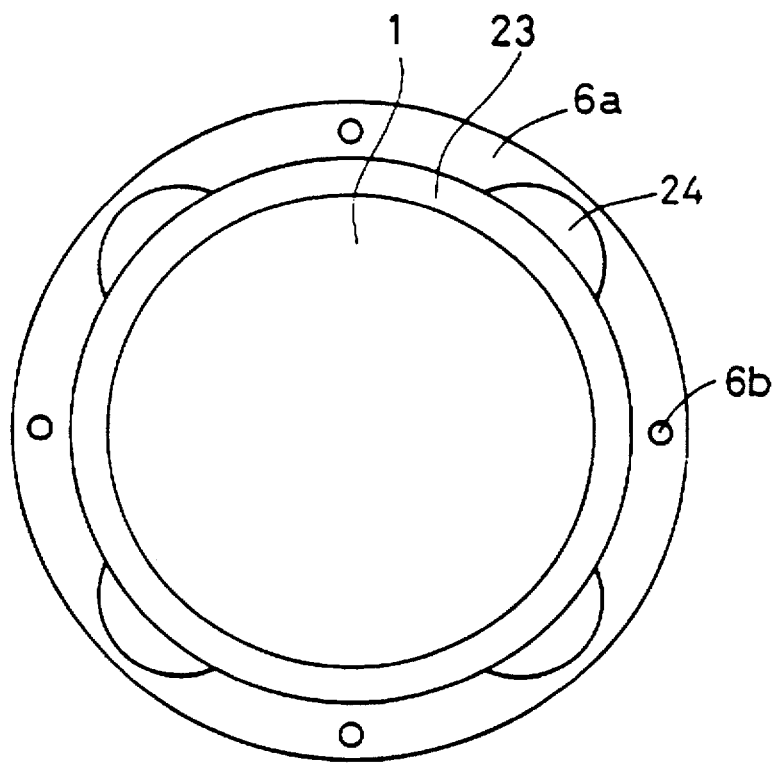
FIG. 4 is a fragmentary plan view of the device in the preferred embodiment.

FIG. 4 is a plan view showing the semiconductor substrate 1 fixed to the projection 6a. As shown in FIG. 4, the adhesive agent 24 is applied at intervals around the semiconductor substrate 1. In the projection 6a, through holes 6b passing through from the upper surface to the lower surface of the projection 6a are provided at the positions where the adhesive agent 24 is not applied to. Returning to FIG. 1, this establishes communication between above and below the semiconductor substrate 1. As a result, the gases such as the oxidizing gas, steam, and the like produced in the housing can be exhausted through the exhaust spigot 11b provided above the semiconductor substrate 1, and further the gas in the housing can be replaced by the inert gas.

Figure 5:
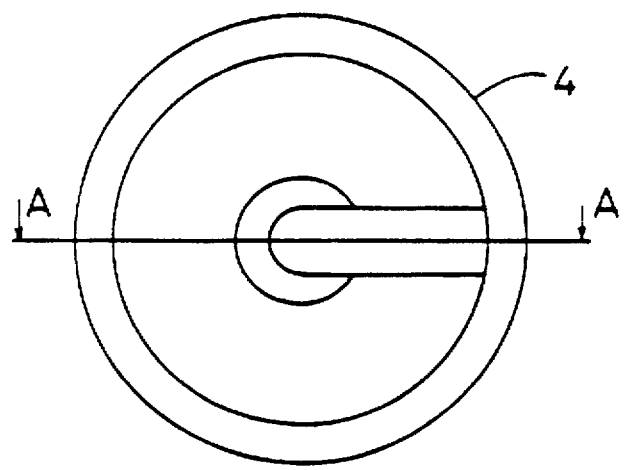
FIG. 5 is a front sectional view of the main electrode in the preferred embodiment.
Figure 6:
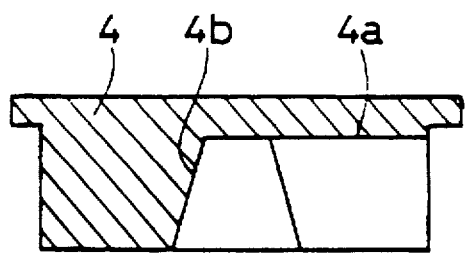
FIG. 6 is a bottom view of the main electrode in the preferred embodiment.

As shown in FIG. 1, notches (grooves) 4a and 4b for introducing the light guide 10 are formed in the main electrode 4. The loss heat generated in the semiconductor substrate 1 is transmitted through the main electrodes 4 and 5 and radiated out of the device. To transmit the loss heat efficiently, it is desired that the volume of the cavity formed in the main electrode 4 by the notches 4a and 4b is as small as possible. To satisfy this demand, as shown in FIG. 5 and FIG. 6, which are respectively a sectional view and a bottom view of the main electrode 4, the shape of the notch 4b at the center of the main electrode 4 is not a cylindrical shape but a frustum of a cone, i.e., it is tapered.

This facilitates insertion of the light emitting end of the light guide 10 and attachments thereof and increases the volume of the metal part of the main electrode 4 to improve the transmission efficiency of the loss heat. The shape of the notch 4b may be a hemisphere in place of a frustum of a cone, or it may take other shapes which have its opening area increasing as it gets closer to the bottom. Though not shown in the figure, the shape of the notch 4a is also preferably set so that it becomes larger as it gets closer to the opening away from the bottom of the groove.

Figure 7:
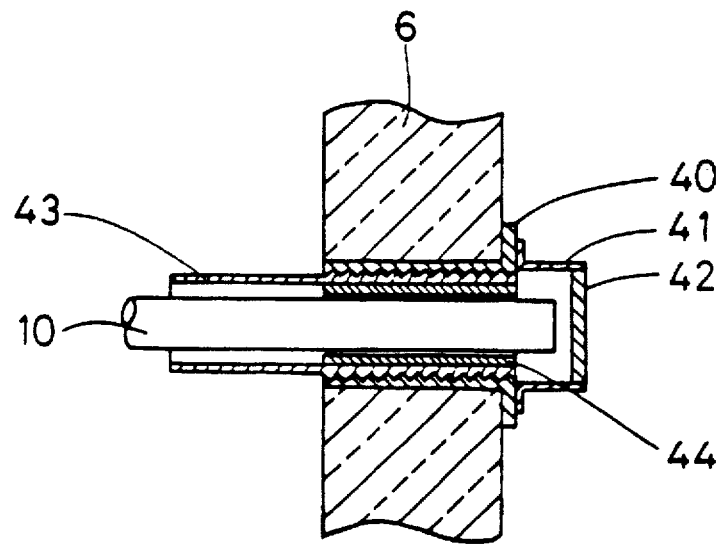
FIG. 7 is an enlarged front sectional view of the vicinity of the light introducing window in the preferred embodiment.

FIG. 7 is an enlarged front sectional view of the vicinity of the horizontal light entering end in the light guide 10 which bends in the form of "L". A through hole for transmitting the light signals is formed in the horizontal direction in the insulation tube 6. A metal tube 40 is fixedly inserted in this through hole. An optical transmissive light introducing window 42 through which light signals from outside are transmitted is airtightly bonded to this metal tube 40 through a circular ring like fixing jig 41. A tubular body 43 threadingly engages the inner side of the metal tube 40 to be fixedly inserted therethrough.

The tubular body 43 is formed of resin or metal, for example, with its inside diameter somewhat larger than the diameter of the light guide 10 so that they are not in contact with each other. The tubular body 43 projects more inwardly than the inner side of the insulation tube 6. Even if the main electrode 4 in FIG. 1 turns in the assembling work before welding, the notch 4a will not directly abut on the light guide 10 because of the existence of the tubular body 43. That is, the tubular body 43 serves as a protection member for protecting the light guide 10. As the light guide 10 and the notch 4a do not abut on each other, damage of the light guide 10 caused by abutting is avoided, and displacement (positional slipping off) of the light emitting end of the light guide 10 from the light receiving portion 1a of the semiconductor substrate 1 will not be caused, either.

As shown in FIG. 7, an elastic tubular body 44 having flexibility, such as silicone rubber system, is interposed between the tubular body 43 and the light guide 10. The light guide 10 is flexibly supported by the metal tube 40 with this elastic tubular body 44 interposed therebetween. Accordingly, vibration, impact and the like applied from outside are absorbed by the elastic tubular body 44, and the light guide 10 is prevented from being damaged by the vibrations, impact, etc.

Further, expansion and shrinkage of members such as the light guide 10 and the like with repeated temperature change, i.e., temperature cycle are absorbed by the elastic tubular body 44. Accordingly, damage, fatigue and the like resulted from the thermal stresses produced by the temperature cycle can also be prevented. Furthermore, it is advantageous in that the positioning of the light emitting end of the light guide 10 is facilitated.

A reflection preventing film formed of silicon dioxide, for example, having a single layer or multiple layers is formed on the both surfaces of the light introducing window 42 by a method of vapor deposition or the like. This suppresses reflection of light signals which will cause transmission loss of light signals and improves the transmission efficiency. A material which can satisfactorily stand high temperature when soldered is selected for the reflection preventing film, since the formation of the reflection preventing film is performed before the light introducing window 42 is fixed to the fixing jig 41 by soldering or the like. A similar reflection preventing film is formed on both of the light entering end and the light emitting end of the light guide 10 or on one of them to improve the transmission efficiency of light signals.

Figure 8:
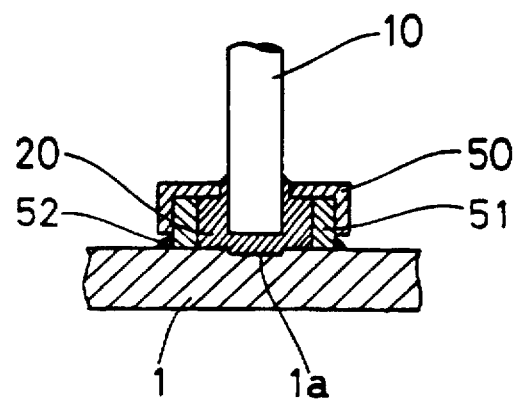
FIG. 8 is an enlarged front sectional view of the vicinity of the light receiving surface in the preferred embodiment.
Figure 9:
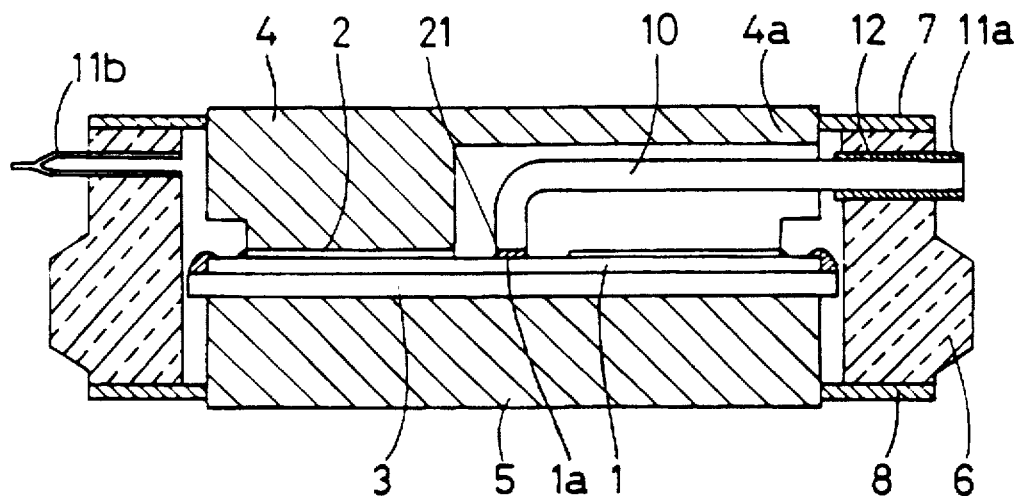
FIG. 9 is a front sectional view of a conventional pressure contact type semiconductor device.
Figure 10:
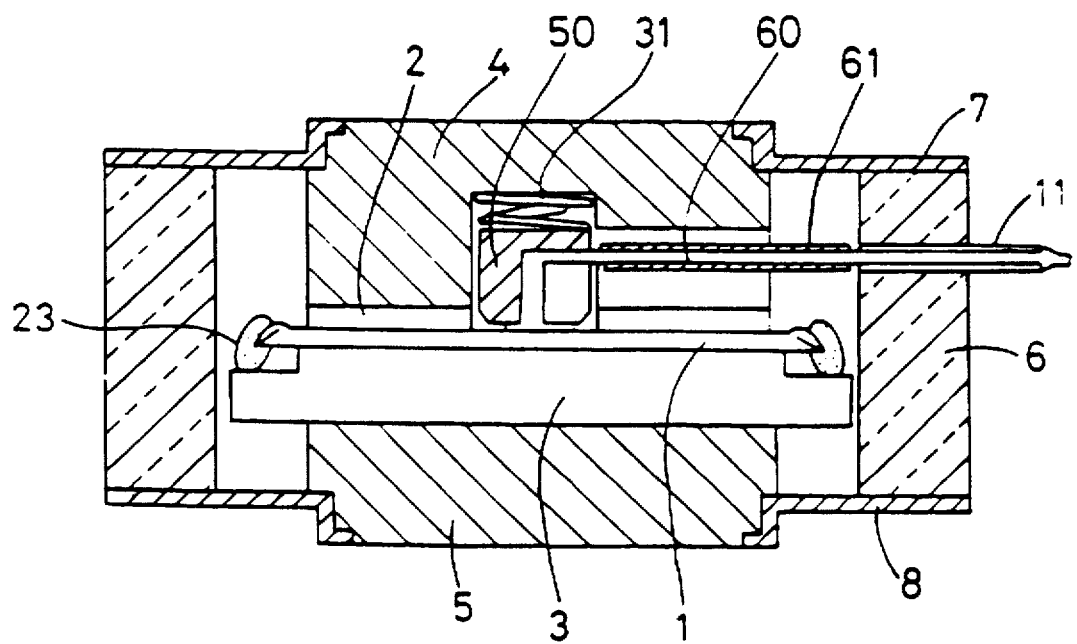
FIG. 10 is a front sectional view of another conventional pressure contact type semiconductor device.

FIG. 8 is an enlarged front sectional view in the vicinity of the light emitting end of the light guide 10. Two guide rings 50 and 51 are used to normally position the light emitting end of the light guide 10 to the light receiving portion 1a of the semiconductor substrate 1. The guide rings 50 and 51 are formed of resin or the like. The guide ring 50 has a through hole formed at its center, into which the light guide 10 is inserted. Furthermore, the guide ring 50 fits to the outer periphery of the guide ring 51.

To fix the light emitting end of the light guide 10, the guide ring 51 is first provided at a position concentric with the light receiving portion 1a of the semiconductor substrate 1 and then it is fixed with adhesive agent 52. After that, optical coupling agent 20 is put inside the guide ring 51. Resin which has some fluidity before solidifying and maintains some flexibility after thermally treated or left at ordinary temperature and solidified, and which has optical transparency and refractive index of about 1.3 to 1.5 is selected for the optical coupling agent 20. Silicone rubber system is suitable for this, for example.

Before the optical coupling agent solidifies, the light emitting end of the light guide 10 is inserted into the optical coupling agent 20 and the guide ring 50 with the light guide 10 previously inserted therein is fitted to the guide ring 51. As the guide ring 51 is fixed at the predetermined position, the light emitting end of the light guide 10 is naturally positioned above the light receiving portion 1a when the guide rings 50 and 51 fit to each other. Accordingly, light signals are surely transmitted to the light receiving portion 1a of the semiconductor substrate 1.

As the optical coupling agent 20 has the flexibility, the expansion and shrinkage of the parts such as the light guide 10 due to the temperature cycle are absorbed by the optical coupling agent 20. Accordingly, damage or the like of the light guide 10 caused by the thermal stresses resulted from the temperature cycle is prevented.

<Examples of Modifications>

(1) In the preferred embodiment described above, the thermal compensating plate 3 and the main electrode 5 are coupled through a single pin located at the center. The thermal compensating plate 3 and the main electrode 5 may be coupled at a plurality of positions by using a plurality of pins in place of the single pin. In this case, at least one of the thermal compensating plate 3 and the main electrode 5 is preferably coupled by pins with some play so that the thermal distortion caused by the difference of thermal expansion coefficients between the thermal compensating plate 3 and the main electrode 5 can be absorbed.

(2) The projection 6a does not necessarily have to be formed on the entire periphery of the inner wall of the insulation tube 6. For example, they may be formed at four positions along the entire periphery at equal intervals. This structure can also stably support the semiconductor substrate 1. To support it more stably, however, it is preferable to form the projection 6a around the entire periphery.

(3) The structure is also possible where the projection 6a is not provided on the inner wall of the insulation tube 6 and the semiconductor substrate 1 is fixed on the inner wall of the insulation tube 6 through the insulation resin (resin for protection) 23. In this case, the insulation resin 23 may abut on the inner wall of the insulation tube 6 with elastic restoring force of the insulation resin 23 itself without adhesive agent applied thereto to be supported by the insulation tube 6. Otherwise, adhesion may be applied so that the insulation resin 23 does not slip off in the axial direction of the insulation tube 6.

Further, the insulation resin 23 does not necessarily have to be attached around the entire periphery of the semiconductor substrate 1. For example, it may be attached at four positions along the entire periphery at equal intervals. To support it more stably, however, it is more preferable that the insulation resin 23 is formed around the entire periphery.

(4) The input end of the light guide 10 may be directly provided into the through hole formed in the insulation tube 6 only through the elastic tubular body 44 without the metal tube 40 and the tubular body 43. This structure can also prevent the damage of the light guide 10 caused by vibrations, impact and the like applied from outside and transmitted to the light guide 10.

(5) Although the two guide rings 50 and 51 are used in the preferred embodiment described above, a single guide ring 51 may be used to fix the light emitting end of the light guide. In the device with this structure, the optical coupling agent is put in the guide ring 51 and the light emitting end of the light guide 10 is inserted into the optical coupling agent before it solidifies. At this time, the light guide 10 is guided by the guide ring 51 to be positioned at the most suitable position.

(6) The structure of positioning the thermal compensating plate and the like produce the same effects when they are applied to the electric trigger type thyristors, such as the GTO thyristors, or semiconductor devices such as diodes not only to the light trigger type thyristors. In the electric trigger type thyristor, a signal transmission path for transmitting electric control signals is provided in place of the light guide 10, and the notches 4a, 4b, the tubular body 43, etc. produce the same effects as those in the above-described embodiment.

While the invention has been shown and described in detail, the foregoing description is in all aspects illustrative and not restrictive. It is therefore understood that numerous modifications and variations can be devised without departing from the scope of the invention.

What is claimed is:

1. A pressure contact type semiconductor device, comprising a semiconductor substrate, a thermal compensating plate in alloy-free contact with the semiconductor substrate, and a main electrode in contact with the thermal compensating plate, wherein said thermal compensating plate and said main electrode fit to different ends of a pin to be positioned relatively to each other.

2. The pressure contact type semiconductor device according to claim 1, wherein said thermal compensating plate and said main electrode fit to said pin only at approximate center positions of respective contact surfaces.

3. A pressure contact type semiconductor device, comprising a semiconductor substrate, a main electrode pressure-contacted to the semiconductor substrate, and a control signal transmission path for transmitting a control signal to said semiconductor substrate, wherein said main electrode defines a groove accommodating said control signal transmission path and a shape of the groove has its opening width increasing from a deeper portion toward an opening portion.

4. A pressure contact type semiconductor device according to claim 3, further comprising an insulation tube surrounding said semiconductor substrate, wherein a part of said control signal transmission path is attached to said insulation tube.

5. A pressure contact type semiconductor device according to claim 3, further comprising a thermal compensating plate in contact with said semiconductor substrate and said main electrode; and a ring which fits to outer peripheries of said thermal compensating plate and said main electrode.

6. The pressure contact type semiconductor device according to claim 4, wherein said semiconductor substrate has a main surface, said main electrode has a major surface, said control signal transmission path bends in a form of character "L" and has a first and second path portion contiguous to each other, said first path portion is normal to said main surface of said semiconductor substrate and contacts with a center of said main surface at an end thereof, said second path portion is parallel to said main surface, and passes through and attached to said insulation tube, and said groove is defined along said major surface from a center portion thereof to an outer periphery thereof.

7. The pressure contact type semiconductor device according to claim 6, further comprising a thermal compensating plate interposed between said main surface of said semiconductor substrate and said major surface of said main electrode so that said main electrode is pressure-contacted to said semiconductor substrate through said thermal compensating place, wherein said thermal compensating plate defines a through hole at a center thereof through which said first path portion passes with play.

8. A light trigger type semiconductor device, comprising a semiconductor substrate, an insulation tube surrounding the semiconductor substrate and a light guide transmitting a light signal to said semiconductor substrate, wherein a part of said light guide is accommodated in a tubular body and attached to said insulation tube.

9. The light trigger type semiconductor device according to claim 8, wherein said tubular body projects inside said insulation tube and said light guide is inserted into the tubular body with play.

10. The light trigger type semiconductor device according to claim 8, wherein a part of said light guide is inserted into said tubular body through an elastic tubular body.

11. A light trigger type semiconductor device, comprising a semiconductor substrate, an insulation tube surrounding the semiconductor substrate and a light guide transmitting a light signal to said semiconductor substrate, wherein a part of said light guide is attached to said insulation tube through an elastic tubular body.

12. A light trigger type semiconductor device, comprising a semiconductor substrate, a light guide transmitting a light signal to a light receiving surface of the semiconductor substrate and a guide ring fixed on said semiconductor substrate to surround said light receiving surface, wherein a light emitting end of said light guide is inserted into said guide ring.

13. The light trigger type semiconductor device according to claim 12, wherein the light emitting end of said light guide is fixed inside said guide ring by an adhesive optical coupling agent put in said guide ring.

14. The light trigger type semiconductor device according to claim 12, comprising said guide ring as a first guide ring, and further comprising a second guide ring into which the light emitting end of said light guide is inserted, wherein the light emitting end of said light guide is inserted into said first guide ring with play and said second guide ring fits to an outer periphery of said first guide ring.

15. A pressure contact type semiconductor device, comprising a semiconductor substrate, a thermal compensating plate in contact with the semiconductor substrate and a main electrode in contact with the thermal compensating plate, and further comprising a ring which fits to outer peripheries of both of said thermal compensating plate and said main electrode.

16. The pressure contact type semiconductor device according to claim 15 further comprising an elastic body interposed between said main electrode and said ring, wherein the ring engages with an edge portion of a surface abutting on said main electrode of said thermal compensating plate, and said ring is pressed and energized against said thermal compensating plate by an elastic force of said elastic body.

* * * * *